United States Patent [19]
Fraivillig

[11] Patent Number: 6,015,607
[45] Date of Patent: *Jan. 18, 2000

[54] FLEXIBLE LAMINATES AND METHOD OF MAKING THE LAMINATES

[75] Inventor: James Fraivillig, Seabrook, Tex.

[73] Assignee: Fraivillig Materials Company, Austin, Tex.

[ * ] Notice: This patent issued on a continued prosecution application filed under 37 CFR 1.53(d), and is subject to the twenty year patent term provisions of 35 U.S.C. 154(a)(2).

[21] Appl. No.: 08/834,105

[22] Filed: Apr. 14, 1997

Related U.S. Application Data

[63] Continuation of application No. 08/495,945, Jun. 28, 1995, abandoned.

[51] Int. Cl.[7] .............................. H05K 1/03; B32B 27/28
[52] U.S. Cl. .......................... 428/214; 428/216; 428/448; 428/430; 428/458; 428/473.5; 428/480; 428/901; 174/254
[58] Field of Search ................................. 428/473.5, 180, 428/475.2, 450, 447, 448, 458, 337, 336, 333, 209, 901, 457, 214, 216; 174/254

[56] References Cited

U.S. PATENT DOCUMENTS

| | | | |
|---|---|---|---|
| 4,783,695 | 11/1988 | Eichelberger et al. | 257/668 |
| 4,820,781 | 4/1989 | Policastro et al. | 525/431 |
| 5,106,667 | 4/1992 | Ochsner et al. | 428/76 |
| 5,157,589 | 10/1992 | Cole, Jr. et al. | 361/414 |
| 5,219,640 | 6/1993 | Gazit et al. | 429/209 |
| 5,232,548 | 8/1993 | Ehrenberg et al. | 156/630 |
| 5,237,205 | 8/1993 | Newman | 247/783 |
| 5,298,331 | 3/1994 | Kanakarajan et al. | 428/458 |
| 5,359,496 | 10/1994 | Kornrumpf et al. | 361/795 |
| 5,434,751 | 7/1995 | Cole, Jr. et al. | 361/792 |
| 5,480,841 | 1/1996 | Bickford et al. | 437/209 |
| 5,552,222 | 9/1996 | Bolon et al. | 428/379 |
| 5,728,473 | 3/1998 | Inoue et al. | 428/448 |
| 5,734,008 | 3/1998 | Shirasaki et al. | 528/353 |
| 5,795,162 | 3/1996 | Lambert | 439/63 |
| 5,859,181 | 1/1999 | Zhao et al. | 528/353 |

OTHER PUBLICATIONS

Encyclopedia of Polymer Science and Engineering, "Polyimides", vol. 12, p 370, 1985.

*Primary Examiner*—D. S. Nakarani
*Assistant Examiner*—D. Lawrence Tarazano
*Attorney, Agent, or Firm*—Rosenthal & Osha L.L.P.

[57] ABSTRACT

A flexible laminate for use in flexible circuitry including at least one layer of a flexible film substrate; at least one layer of a metal foil on top of the flexible film substrate; and an adhesive including a polyetherimide, and preferably a siloxane polyetherimide copolymer, present between said flexible film substrate and said metal foil; in which the adhesive bonds the metal foil to the flexible film substrate.

7 Claims, 7 Drawing Sheets

FLEXIBLE LAMINATES AND METHOD OF MAKING THE LAMINATES

This is a continuation of application Ser. No. 08/495,945 filed Jun. 28, 1995, now abandoned.

FIELD OF THE INVENTION

The invention relates to flexible laminates and processes for making flexible laminates. More particularly, this invention relates to an improved adhesive for bonding layers in flexible laminates.

BACKGROUND OF THE INVENTION

Printed circuits are used as a replacement for wiring when connecting electric components in an intricate electrical system. Printed circuits save space, weight and labor, and increase reliability of the circuit compared with round wire connections. Instead of metal round wire, the conventional printed circuit comprises a metal foil, generally copper, which is adhered to a base, typically fiberglass or epoxy, to form a metal-clad layer. The adhered metal foil is then imaged and etched into a desired pattern to form a circuit.

A particular type of printed circuitry, known as flexible printed circuits or "Flex", has the same basic structure as conventional hard printed circuit boards. Flex, however, uses a base film made of a flexible, dielectric material such as plastic. The dielectric substrate is typically a polyimide or polyester.

The flexible circuit contains at least one layer of metal foil bonded to a substrate with an adhesive. However, the complexity of most circuit designs requires that multiple layers be used. In the case of multilayer circuits, adhesives are required between multiple layers. In addition, flexible circuits generally require coverlays which are films comprised of an insulating material coated with adhesive. Commonly used materials for the insulating film include polyester and polyimide. Conventional adhesives for bonding the coverlays include polyester, acrylic and epoxy.

Flexible circuits are widely used in both the consumer and military markets, in specific applications where it has design advantages over standard hardboard and round wire technology. The plastic film, generally 25–75 microns thick, allows electronic packaging to be very thin and physically conform to the application. In aerospace applications, flexible circuits are used primarily to save space and weight. In consumer applications such as cameras, mobile phones and PCMCIA cards for notebook computers, flexible circuits serve the same purpose—saving space and weight. In computer disk drives, flexible circuits are used for their flexibility, allowing the cycling of the read/write head across the hard drive many millions of times.

The metal foil can be adhered to the base film by using adhesives or by using non-adhesive techniques. Adhesiveless laminates, in which the metal is directly bonded to the substrate without the use of an adhesive, have been proposed to decrease circuit thickness, increase flexibility and enhance thermal conductivity. Such techniques include plating and vapor or sputter deposition. It has been found, however, that such techniques suffer from a slow rate of manufacturing and high cost.

Conventional adhesives used to bond metal foil to dielectric substrates include polyimides, polyesters, modified epoxies, acrylics, and fluorocarbons. Polyimide adhesives provide a low coefficient of thermal expansion between the dielectric substrate and adhesive layers, as well as good electrical properties, and good chemical and thermal resistance. However, they require very high processing temperatures and are expensive. Polyester adhesives are flexible, have good chemical resistance and electrical properties, but only fair thermal resistance. Modified epoxies have thermal resistance and good electrical properties, but only fair chemical resistance and flexibility. Acrylic adhesives offer thermal and chemical resistance, electrical properties, and good flexibility. Fluorocarbons offer good thermal resistance and electrical properties, as well as excellent chemical resistance and flexibility, but poor dimensional stability.

The adhesives that bond the metal conducting foil to the substrate film, as well as adhesives that bond multiple layers together and cover the finished circuit from the environment, have proven to be the weak link in flexible circuit manufacturing and use. None of the conventional adhesives possess the combination of high temperature stability, high strength, and resistivity demanded by the industry at a reasonable cost.

SUMMARY OF THE INVENTION

The invention provides a flexible laminate that allows flexible circuitry to be made in a robust manufacturing process with high yield, that will survive harsh application environments, and that requires lower processing temperatures than conventional polyimide adhesives.

In one aspect, the invention relates to a flexible laminate, comprising a flexible film substrate and a first adhesive layer comprising a polyetherimide formed on one side of the flexible film substrate. In some embodiments, the polyetherimide is a siloxane polyetherimide copolymer. In some embodiments, the laminate further comprises a second adhesive layer comprising a polyetherimide formed on the other side of the flexible film substrate.

In another aspect, the invention relates to a flexible circuit, comprising a first flexible film substrate selected from the group consisting of polyimide, polyester, and polyetherimide, a first adhesive layer comprising a polyetherimide formed on one side of the first flexible film substrate, a second adhesive layer comprising a polyetherimide formed the other side of the first flexible film substrate, a first metal foil layer adhered to the first flexible film substrate by said first adhesive layer, and a second metal foil layer adhered to the first flexible film substrate by the second adhesive layer. In some embodiments, the circuit further comprises a second flexible film substrate selected from the group consisting of polyimide, polyester, and polyetherimide, a third adhesive layer comprising a polyetherimide formed on one side of the second flexible film substrate, a fourth adhesive layer comprising a polyetherimide formed the other side of the second flexible film substrate, a third metal foil layer adhered to the second flexible film substrate by the third adhesive layer, a fourth metal foil layer adhered to the second flexible film substrate by the fourth adhesive layer, and a bondply bonding the second metal foil layer to the third metal foil layer.

In another aspect, the invention relates to a method for making a flexible laminate, comprising the steps of: providing a flexible film substrate; dissolving a polyetherimide copolymer resin in a solvent; and spreading the dissolved polyetherimide copolymer resin on the flexible film substrate. In some embodiments, the method further comprises the steps of: laminating a metal foil on the polyetherimide copolymer resin to form a clad; and applying heat and pressure to the clad.

In another aspect, the invention relates to a product for achieving heat transfer between a heat-producing component and a heat-sinking device, comprising: a film substrate comprising alumina-filled polyimide film; and means for adhering the film substrate to at least one of the heat-producing component and the heat-sinking device.

Further aspects, features, and advantages will become apparent from the following.

DESCRIPTION OF THE PREFERRED EMBODIMENTS

Figure 1:
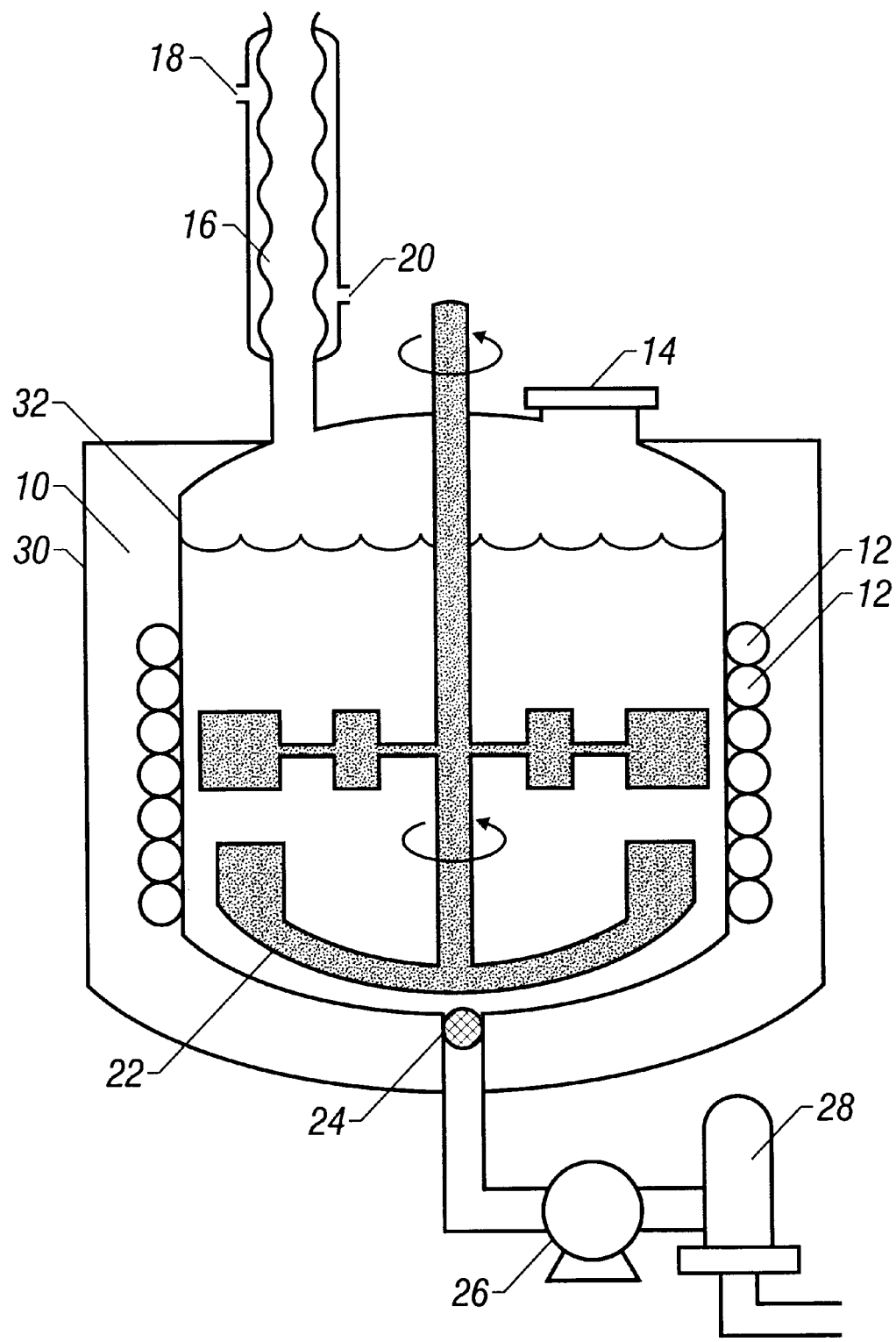
FIG. 1 is a cross-section of a reaction vessel for resin dissolution.

Preferred embodiments of the invention will now be described in detail with reference to the accompanying figures.

Electrical insulation of flexible circuits is accomplished with three types of film layers, all of which require adhesive layers. Cladply bonds the copper foil in unetched sheet form to a base material to form "clad." Bondply bonds together the multiple layers of printed circuitry Bondply, as used herein, is defined to be a dielectric film with an adhesive on both sides. Cover layers, or "coverlays," are applied to outer surfaces of the multilayer laminate to protect the finished circuit from the environment. Adhesives are used to bond copper foil to the dielectric substrate and to bond insulating cover layers to the circuit surface.

Polyimide film has long been the leading substrate for high-end flexible applications, partly due to its excellent balance of properties, but primarily because of its resistance to the high temperature of soldering. Polyester films are also used in less-demanding applications and are much less expensive.

In accordance with the invention, it has been determined that polyetherimide adhesives such as Ultem®, and preferably siloxane polyetherimide copolymer such as Siltem® (both trademarks of G.E. Plastics), provide the flexible circuit industry with good bonding characteristics to metal foil, polyimide, polyester, or polyetherimide film, adhesive-coated surfaces, and other metal and plastic surfaces; an excellent balance of properties required by circuit processing and application end uses; fast bonding, which expedites circuit manufacture; low temperature processing, allowing use in existing industry processes; controllable, non-smearing flow of adhesive; proper curing during coating or lamination (the polyetherimide is already fully-reacted); and long shelf life of both liquid adhesive and coated film at room temperature. In the following description of the preferred embodiments, the term "polyetherimide" shall be considered generic to either a polyetherimide, such as ULTEM®, or a siloxane polyetherimide, such as SILTEM®.

The polyetherimide adhesive has properties very similar to that of polyimide base film, allowing flexible circuitry to be made in a robust manufacturing process with high yields and to survive in harsh application environments. The polyetherimide adhesive allows lamination quickly in standard presses (which generally have a maximum operating temperature of 200° C.), and with no vacuum-assistance for outgassing.

In contrast, conventional thermoset adhesives have low temperature bonding, but require lamination cycles of up to 5 hours for complete curing. The platen press must start and finish the lamination process at nearly room temperature, necessitating process time for heat-up and cool-down to and from the curing temperature. The polyetherimide adhesive, preferably on polyester, polyimide, or polyetherimide film, can be put directly into a hot, constant temperature platen press for lamination. Time-consuming temperature cycles are not required.

Thermoplastic polyimide adhesives disadvantageously require temperatures of 230–350° C. for bonding and long cycle times in the lamination process. To reach these high bonding temperatures, autoclaves are required. Laminations with these polyimide adhesives must be carefully prepackaged into vacuum bags, and placed into the autoclave at room temperature. Time-consuming heat-up and cool-down cycles to and from the high bonding temperatures are required.

The advantages of easier and faster lamination extend not only to the initial film/copper lamination, but to each subsequent lamination step in the manufacture of multi-layer circuitry.

The lamination process will now be described in detail. Referring to FIG. 1, a reaction vessel has an inner tank 32, an outer wall 30 and an insulating layer 10 between the inner tank and the outer wall. Heating and/or cooling tubes 12 are located in the insulating layer 10 and surround the inner tank 32. The inner tank 10 has an addition port 14 and a vent equipped with a condenser 16. The condenser is cooled with water flowing from inlet port 20 to exit port 18. The inner tank is equipped with an impeller 22 for agitation of reaction vessel contents. A valve 24 controls flow of reaction vessel contents to a transfer pump 26 and filter 28.

The reaction vessel is preferably stainless steel and has oil or electric heating. The reactor also preferably has high-shear agitation and reflux capabilities. The reaction vessel should also have cooling capabilities.

In a particular embodiment, the reaction vessel is charged with N-methyl pyrrolidone (NMP) as a solvent. NMP is heated up to about 100–200° C. Polyetherimide copolymer, resin such as Ultem® or siloxane polyetherimide copolymer such as Siltem® (both available from G.E. Plastics) is dissolved in the hot NMP over a period from about 2–5 hours depending on the NMP temperature, agitation rate, resin concentration and resin addition rate. Dissolution between about 40% by weight of polyetherimide resin in NMP is possible, but 20–30% is recommended. Polyetherimide resin should be added gradually to the hot NMP to ensure the optimum dissolution rate. The resin addition should span about one-half of the total process cycle. Sampling the mixture at the bottom of the reactor will allow monitoring of resin dissolution. Some foaming may occur which settles over time. When the resin is completely dissolved, the reactor should be cooled to about 40–70° C. with some agitation. The resin can then be drained or pumped through a filter and into containers for storage and shipping. The filter should be sufficient to remove particulates and undissolved resin from about 1–10 microns in size.

Figure 2:
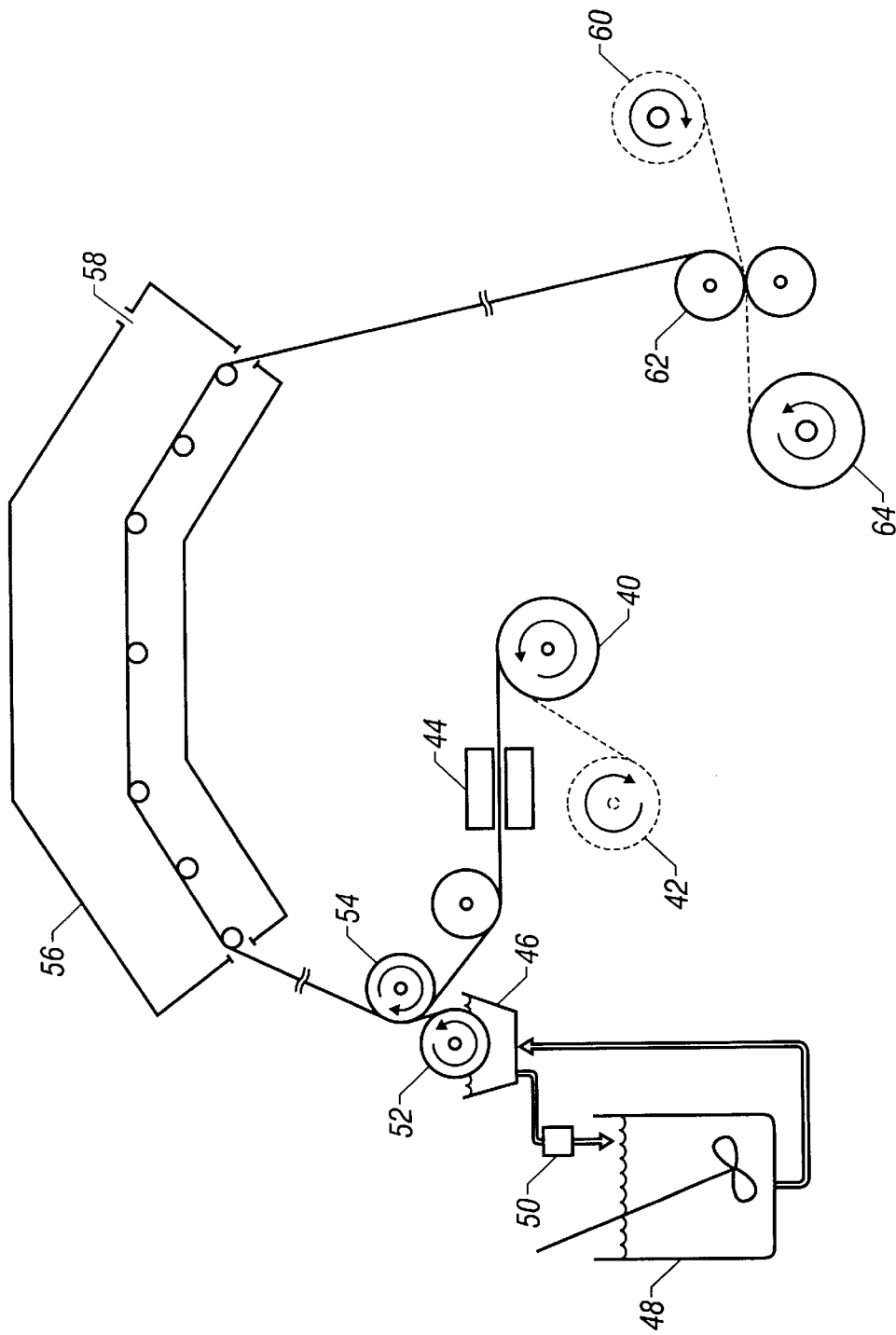
FIG. 2 is a schematic diagram of a film-coating process.

Referring to FIG. 2, a base roll of aromatic polyimide film 40, typically having a thickness in the range of 0.5 to 5 mil (available from DuPont under the tradename Kapton®) has interleaving removed on roll 42. The film is then subjected to corona treatment 44. Of course, other materials may be used for the film 40, including polyester and polyetherimide.

The polyetherimide in NMP solution is agitated in coating bath 48 and pumped into coating trough 46. A filter 50 removes contaminants from the coating solution, which is recycled back into coating tank 48. The film is passed through coating roll 52 and backup roll 54 to drying oven 56 having solvent vapor exit port 58. The film is passed through nip rolls 62 and interleaving 60 is added before the film is wound on takeup roll 64.

The polyetherimide in NMP solution preferably has a viscosity of 10–30 poise for film coating in reverse roll or gravure technologies, and 50–200 poise for slot die. This may require thinning of the solution with NMP or aromatic hydrocarbons (xylene, MEK, etc.) before coating. A solution that is about 20–25% by weight polyetherimide in NMP is about 15 poise. Thinning with solvents having boiling points lower than NMP may improve film surface wetting, enhance solvent drying in the oven, and save raw material cost.

Aromatic polyimide film is purchased commercially in roll form in thicknesses from 8 to 125 micron. Inorganic fillers may be used to tailor properties. For example, alumina filler may increase thermal conductivity. The film surface should be prepared before coating to enhance adhesive bonding because adhesion failure mode is typically at the film/adhesive interface. Treatments include corona, flame, plasma, acid/base wash, and chemical priming.

The polyetherimide in NMP solution is applied to the film web to obtain a dry thickness of about 3 to 75 microns, depending on the application. When the adhesive contains 20% solids, a wet coating of 15–375 microns can be applied. To fine-tune coatability, the temperature of the adhesive solution may be increased, which reduces viscosity, by heating the coating tank.

The drying oven 56 heats the web surface temperature to 140–250° C. by forcing hot air (180–280° C.) over the coated film, driving off the solvent, which then is vented to an incinerator. The dry adhesive surface may be slightly tacky, so an inexpensive plastic interleaving material is used for enhanced film windup and roll formation. If adhesive is to be applied to the second side of the film in a subsequent step, the interleaving material should be removed before entering the high-temperature oven for a second pass.

The adhesive contracts 80% with the loss of solvent. Due to stresses from adhesive shrinkage during solvent evaporation and drying, one-side coated film may curl, especially when the dry coating is of like or greater thickness than the base film. Curling needs to be minimized for flexible circuit applications, where flatness is highly desirable.

Curling can be reduced or eliminated in a modified process wherein the adhesive layer is coated and dried on a release sheet, and hot roll laminating the release sheet to the polyimide film. The curl can also be reduced or eliminated by reinforcing the coated film with a heavy paper liner having a low tack adhesive and removing the liner before subsequent processing.

Figure 3:
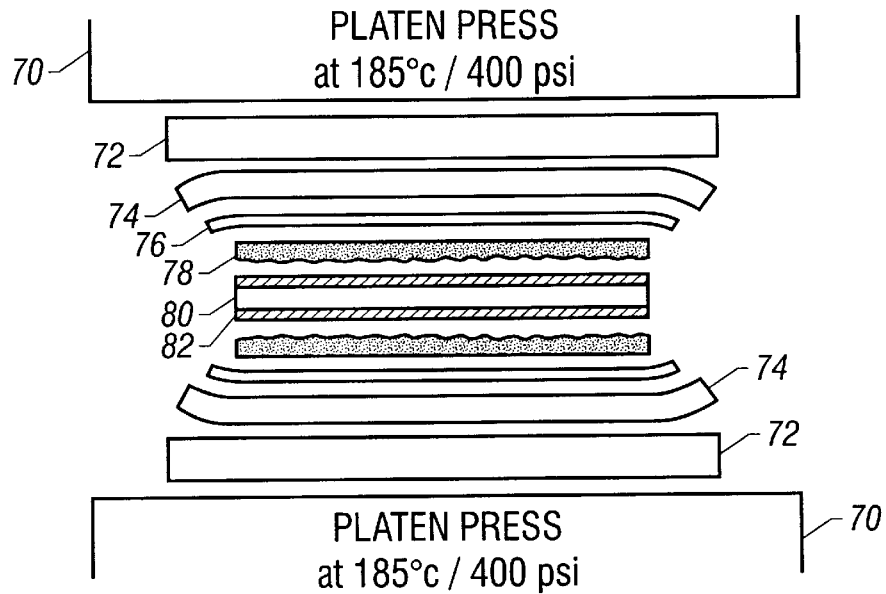
FIG. 3 shows a batch mode lamination process.

Lamination to metal (usually copper) can be done in batch mode with a platen press (flat plates), or continuously with hot-nips or hot-belts, to make clad. Referring to FIG. 3, a platen press is shown for batch lamination of substrate, foil, and adhesive layers. Platens 70 apply pressure to caul plates 72. Press pads 74 protect the laminate from damage by the caul plates and assist conformance. The polyimide film 80 is coated with polyetherimide adhesive 82, is overlaid with copper foil sheets 78. A release sheet 76 separates copper foil sheets 80 from press pads 74. For optimum bond strength, the glass-transition temperature of the polyetherimide (170–220° C.) is exceeded. For a given coated film, bond strength is a function of temperature, pressure, and time. The thermoplastic adhesive resin must physically move into the irregularities of the adjacent surface to ensure bonding. Because polyetherimide is viscous at lower temperatures, it must be forced into the adjacent surfaces.

Copper foil (19–75 microns thick) is generally used for the conductive layer of printed circuits. Foil is manufactured by rolling or electroplating into roll form. One side of the copper foil will be treated to prevent oxidation (tarnishing), while the other side can be roughened and treated for adhesion promotion. The foil may be sheeted for platen press lamination.

Before lamination in a platen press, sheet(s) of the coated film are laid up with copper foil sheets between stainless steel caul plates (about 3 mm thick), silicone rubber press pads (about 3 mm thick), and release sheets (usually PTFE film, 25–50 micron). This lay-up is then placed in the hot press. Bond conditions of 400 psi for 3–30 minutes at 220–300° C. (preferably 230° C.) for polyetherimide and 170–250° C. (preferably 185° C.) for siloxane polyetherimide are sufficient to effect lamination.

Figure 4:
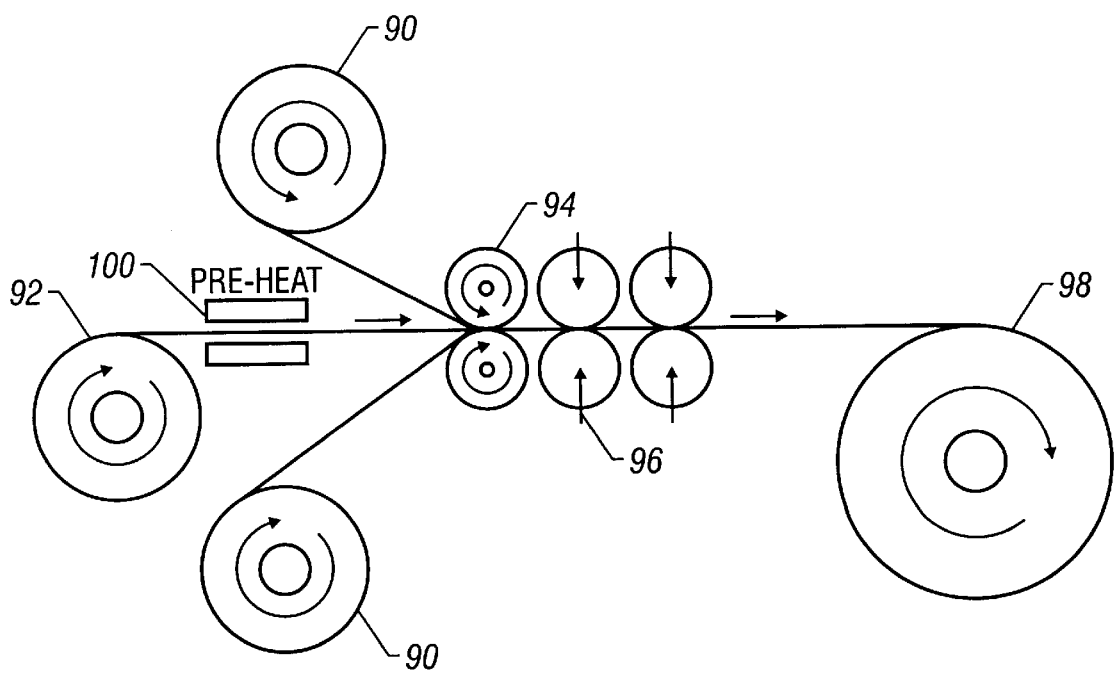
FIG. 4 shows a continuous mode lamination process.
Figure 5A:
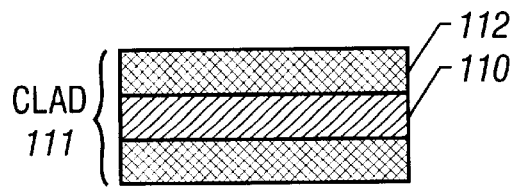
FIGS. 5A to 5F an etching process for a flexible circuit.
Figure 5B:
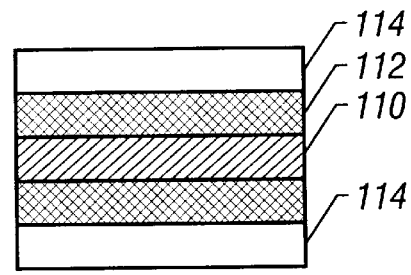
Figure 5C:
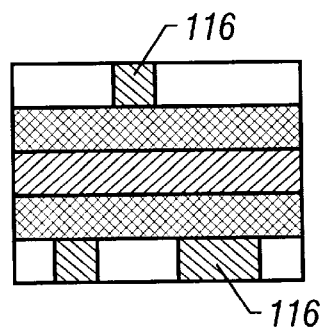
Figure 5D:
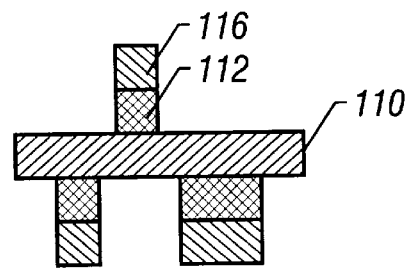
Figure 5E:
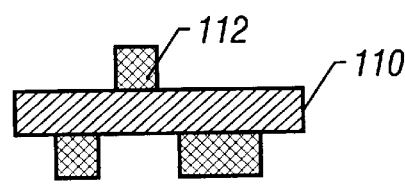
Figure 5F:
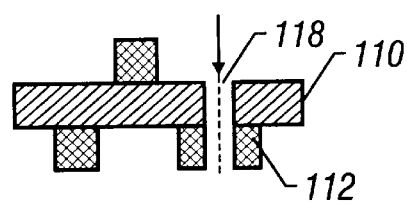

Referring to the continuous-roll lamination process shown in FIG. 4, the coated polyimide film 92 is fed through heat plates 100. Copper foil 90 is applied to both surfaces of coated film 92 and compressed and heated by hot nip rolls 94. Feed rolls 96 advance laminate to take up roll 98. This process requires considerably higher temperature for bonding than the static platen press operation, as roll lamination must compensate for less pressure and time. Continuous roll lamination requires 225–300° C. at a pressure of from about 50–100 psi. Line speed/residence time is selected according to the laminate. Pre-heating zone 100 greatly facilitates lamination.

The best results are obtained when the coated polyimide film is first dried to remove the natural water of absorption (typically 1–2% by weight) before the lamination process of the polyimide film. Drying may be achieved with a convection oven or an in-line zone in a continuous process. Film temperature must exceed 100° C. for time sufficient to remove the residual moisture. Failure to dry the coated polyimide may result in blistering of the film or polymer degradation resulting from contact with superheated steam during lamination.

The polyetherimide adhesive generally bonds most easily to (in descending order): (1) surfaces already coated with the same resin, (2) metal foils, (3) surfaces already coated with similar resins e.g., low-temperature polyimide adhesives), and (4) uncoated polyimide films. The lamination process conditions can be modified according to the surfaces being bonded.

Referring to FIGS. 5–7, cross-sectional views of laminate are shown after sequential steps of circuit assembly. FIG. 5A is a cross-sectional view of a clad 111 wherein copper foil 112 is laminated onto coated film 100. In FIG. 5B, the clad has been coated with a photo-resist layer 114. In FIG. 5C, the photo-resist 114 has been photo-imaged to produce patterns 116 which are resistant to etching. Subsequent etching removes the "unresistant" photo-resist and the copper underneath, producing the results shown in FIG. 5D. The resistant photo-resist is then washed off, leaving only the desired pattern in the copper layers as shown in FIG. 5E. An aperture 118 may then be drilled in appropriate locations to provide electrical communication with desired portions of the copper layer as shown in FIG. 5F.

Figure 6A:
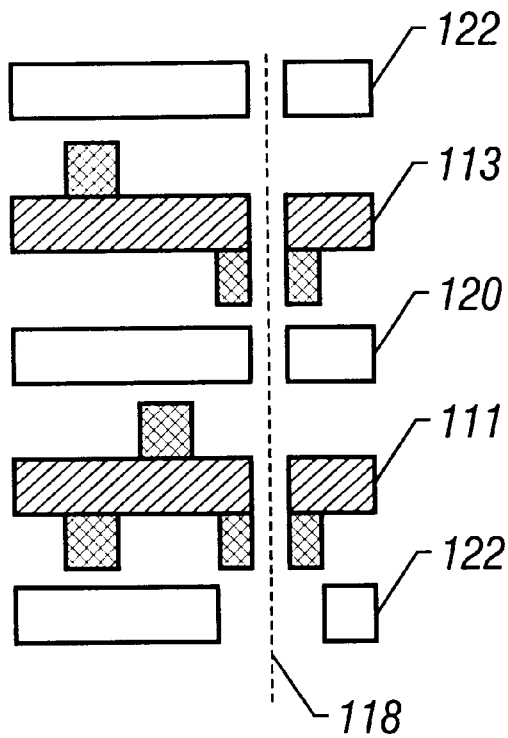
FIGS. 6A and 6B show assembly of a multilayer flexible circuit.
Figure 6B:
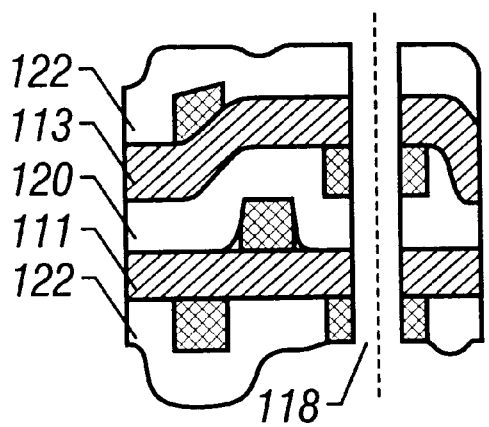

The complexity of many modern applications requires the use of multilayer boards. FIGS. 6A and 6B illustrate the lay-up process of the etched clad to other layers. In the example shown in FIG. 6A, etched clad 111 from the process of FIG. 5 is layed-up to another etched clad 113. A bond ply 120 is provided to isolate clads 111 and 113, and cover layers 122 are provided to protect and isolate the exposed surfaces of the clads. As in FIG. 5F, an aperture 118 may be drilled at appropriate locations to provide electrical contact with desired portions of the etched copper layers. The layers are then laminated, resulting in a multilayer board as illustrated in FIG. 6B.

Figure 7A:
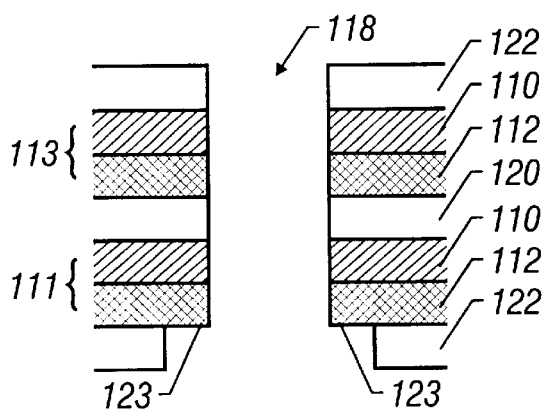
FIGS. 7A to 7D show coating and soldering in a through-hole of a multilayer flexible circuit.
Figure 7B:
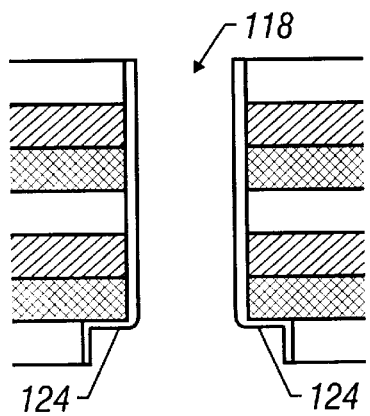
Figure 7C:
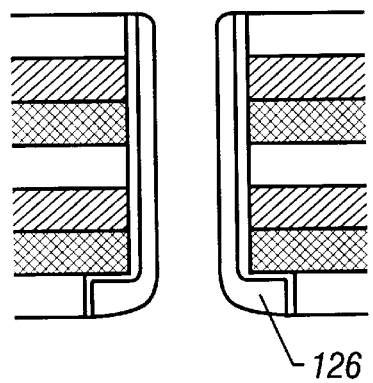
Figure 7D:
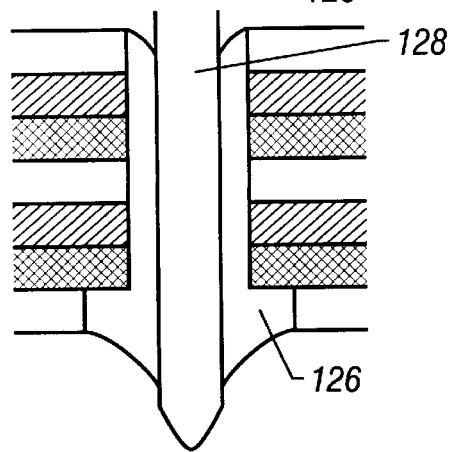

FIGS. 7A through 7D illustrate the process of plating the aperture in the multilayer board and soldering to a pin of an electronic component or making a through-hole connection to another layer. FIG. 7A is a close-up of the aperture 118 in the multilayer board of FIG. 6B. The multilayer board comprises the top cover layer 122, clad 113 having coated film 110 and copper foil 112, bond ply 120, clad 111 having coated film 110 and copper foil 112, and bottom cover layer 122. An additional portion of bottom cover layer 122 is removed to produce exposed pads 123 from copper foil 112. In FIG. 7B, the interior portion of aperture 118 is coated with a plating layer 124. In FIG. 7C, the plating layer 124 is coated with solder 126, and a pin 128 of an electrical component is then inserted as shown in FIG. 7D. Final placement of electrical components is completed by wave solder or infrared solder reflow. As would be well understood by one skilled in the art, components may be mounted by other techniques, including for example using surface mount technology.

Figure 8:
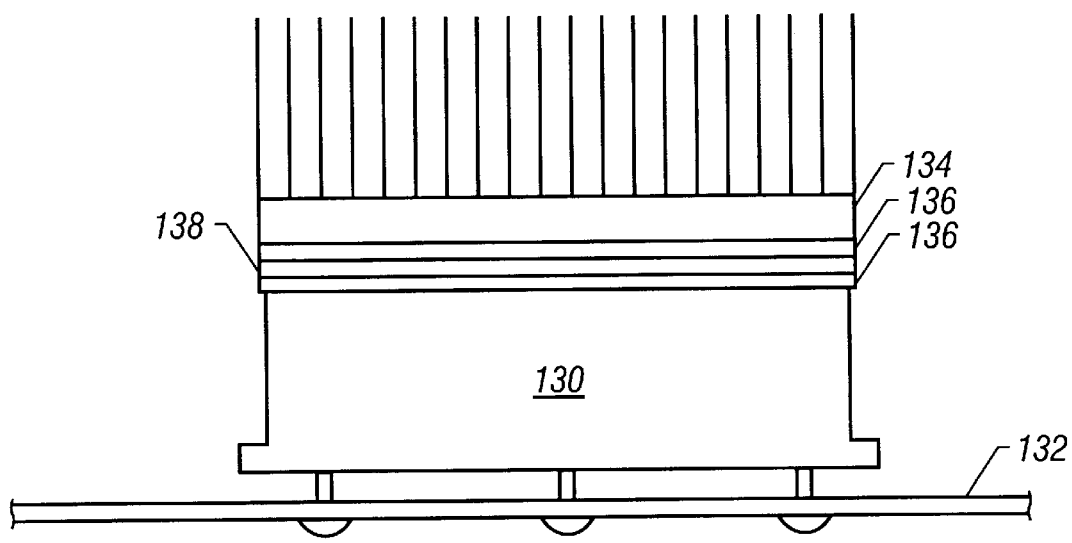
FIG. 8 shows a heat-producing component and a heat sink.

FIG. 8 illustrates another application of polyetherimide adhesive on polyimide film in accordance with the invention. A heat-producing electrical component 130, such as a power transistor or the like, is mounted on a circuit board 132. In many instances, in order to prevent overheating of the component it is necessary to use an external heat sink to move heat away from the component 130. In FIG. 8, a fin-type heat sink 134 is shown mounted on the component 130. It is desirable in this situation to have the greatest possible heat transfer from the component 130 to the heat sink 134, while maintaining electrical isolation between the component and the heat sink. Electrical isolation is extremely important because, in many cases, the sink 134 may extend across more than one component, or may actually form a portion of the exterior casing housing the circuit board 132. At the same time, of course, high thermal conductivity between the component and the heat sink must be maintained, and the means by which the heat sink is adhered to the component 130 must be able to withstand high temperatures.

As noted above, alumina-filled polyimide film has increased thermal conductivity. Thus, an ideal means for adhering a heat-producing electrical component to a heat sink is provided in accordance with the invention by placing a thin coating (0.15 to 0.20 mil) of polyetherimide or siloxane polyetherimide adhesive 136 on one or both sides of an alumina-filled polyimide film 138 of thickness 0.5 to 2 mil. This coated film is heat-sealable, high-temperature resistant, highly electrically resistive, yet has excellent thermal conductivity. Thus, electrical isolation of the heat sink can be ensured without compromising thermal conductivity.

The invention has been described above with reference to specific embodiments. However, the invention is not so limited, but rather is limited only by the scope of the appended claims.

What is claimed is:

1. A flexible circuit, comprising:
   a flexible substrate comprising a polyimide, polyester or polyetherimide, the flexible substrate having a thickness selected to enable flexure consistent with use in the flexible circuit;
   an adhesive layer on the flexible substrate, the adhesive layer consisting of siloxane polyetherimide copolymer as the only polymeric component; and
   a metal foil layer on the adhesive layer.

2. The flexible circuit as defined in claim 1 wherein the flexible substrate comprises alumina-filled polyimide film.

3. The flexible circuit as defined in claim 1 wherein the flexible substrate has a thickness within a range of 0.5 to 5 mil and the adhesive layer has a thickness in a range of 0.15 to 0.30 mil.

4. The flexible circuit as defined in claim 1 wherein the metal foil layer comprises copper having a thickness in a range of 19–75 microns.

5. The flexible circuit as defined in claim 1 further comprising a cover layer on the metal foil layer.

6. The flexible circuit as defined in claim 5 wherein the cover layer comprises a polyetherimide copolymer resin.

7. The flexible circuit as defined in claim 1 wherein the flexible substrate comprises polyimide formed from a mixture of equimolar amounts of diamine and a dianhydride.

* * * * *